United States Patent
Dervay et al.

(10) Patent No.: US 12,237,810 B1
(45) Date of Patent: Feb. 25, 2025

(54) VIBRATION COMPENSATED INTERFEROMETRIC NOISE SUPPRESSED OSCILLATOR (INSO)

(71) Applicant: Raytheon Company, Arlington, VA (US)

(72) Inventors: James Andrew Dervay, Hudson, MA (US); Gary Ian Moore, Fremantle (AU)

(73) Assignee: Raytheon Company, Arlington, VA (US)

( * ) Notice: Subject to any disclaimer, the term of this patent is extended or adjusted under 35 U.S.C. 154(b) by 0 days.

(21) Appl. No.: 18/364,981

(22) Filed: Aug. 3, 2023

(51) Int. Cl.
| | |
|---|---|
| *H03B 5/36* | (2006.01) |
| *H03B 5/18* | (2006.01) |
| *H03L 1/00* | (2006.01) |
| *H03L 7/099* | (2006.01) |

(52) U.S. Cl.
CPC ............. *H03B 5/36* (2013.01); *H03B 5/1817* (2013.01); *H03B 5/1823* (2013.01); *H03L 1/00* (2013.01); *H03L 7/099* (2013.01); *H03B 2200/009* (2013.01)

(58) Field of Classification Search
CPC ........... H03L 1/00; H03L 7/099; H03L 7/081; H03B 5/32; H03B 2202/076; H03B 5/1817; H03B 5/1823; H03B 5/36; H03B 5/1864; H03B 5/187; H03B 5/1876; H03B 5/38; H03B 5/18; H03B 2200/0088; H03B 2200/009
See application file for complete search history.

(56) References Cited

U.S. PATENT DOCUMENTS

| | | | |
|---|---|---|---|
| 4,318,063 | A | 3/1982 | Przyjemski |
| 4,453,141 | A | 6/1984 | Rosati |
| 4,891,611 | A | 1/1990 | Frerking |
| 5,841,322 | A | 11/1998 | Ivanov et al. |

(Continued)

OTHER PUBLICATIONS

Bloch, M., et al., "Acceleration "G" Compensated Quartz Crystal Oscillators", 2009 IEEE International Frequency Control Symposium Joint with the 22nd European Frequency and Time forum, (Apr. 20, 2009), 6 pgs.

(Continued)

*Primary Examiner* — Ryan Johnson
(74) *Attorney, Agent, or Firm* — Schwegman Lundberg & Woessner, P.A.

(57) ABSTRACT

Vibration compensation is provided for Interferometric Noise Suppressed Oscillators (INSOs). In an INSO the error signal at the mixer output responds linearly to changes in carrier frequency. A vibration compensation signal is summed with the error signal at the input to the feedback amplifier to provide the control signal to the loop phase shifter to suppress close-in phase noise near the carrier frequency and to reduce the effects of mechanical vibrations on oscillator phase noise. The addition of the vibration compensation signal does degrade carrier suppression, hence increases the flicker noise contributed by the INSO's LNA but does so without degrading overall oscillator phase noise. In a frequency tuned configuration, the vibration compensation signal reduces the effects of mechanical vibrations on oscillator phase noise independent of the tuning voltage applied to the phase shifter.

20 Claims, 10 Drawing Sheets

(56) References Cited

U.S. PATENT DOCUMENTS

| | | | |
|---|---|---|---|
| 9,350,293 B1* | 5/2016 | Desrochers, II | H01P 1/20 |
| 2005/0007204 A1* | 1/2005 | Howe | H03L 7/00 |
| | | | 331/107 DP |
| 2014/0104006 A1* | 4/2014 | Clark | H03L 1/00 |
| | | | 331/29 |
| 2016/0226500 A1* | 8/2016 | Zhao | H03L 1/00 |
| 2017/0257105 A1* | 9/2017 | Patrizi | H03L 1/00 |

OTHER PUBLICATIONS

Colson, Carl, "Vibration Compensation of the Seektalk Rubidium Oscillator", 36th Annual Frequency Control Symposium, (Jun. 2, 1982), 3 pgs.

Hati, A., et al., "Vibration Sensitivity of Microwave Components", 2007 IEEE International Frequency Control Symposium Joint with the 21st European Frequency and Time Forum, Geneva, Switzerland, 541-546.

Vig, John R., "Quartz Crystal Resonators and Oscillators", For Frequency Control and Timing Applications—A Tutorial, (Jan. 2004), 21 pgs.

Wanner, Shannon, "Vibration Correction of Oscillator for Phase Noise Impairments Utilizing MEMS Accelerometer", 2017 Texas Symposium on Wireless and Microwave Circuits and Systems (WMCS), 5 pgs.

Yoneoka, Shingo, et al., "Active Electrostatic Compensation of Micromechanical Resonators Under Random Vibrations", Journal of Microelectromechanical Systems, vol. 19, No. 5, (Oct. 2010), 1270-1272.

* cited by examiner

VIBRATION COMPENSATED INTERFEROMETRIC NOISE SUPPRESSED OSCILLATOR (INSO)

BACKGROUND

Field

This disclosure relates to vibration compensation of loop oscillators and more particular to vibration compensation of interferometric noise suppressed oscillators (INSOs).

Description of the Related Art

Phase noise is an important property of oscillators in general and low phase noise oscillators find application in precision timing and radar systems, for example. In mobile applications, such as mobile radars, oscillators are often subjected to mechanical vibrations. Accelerations associated with these vibrations cause stresses and mechanical distortions in the oscillator, particular in the resonator components which determine the oscillator frequency. These distortions result in small variations in the oscillator frequency. The so-called vibration sensitivity of an oscillator is generally assigned the symbol F with the relationship $\Delta f = \Gamma \cdot f_0 \cdot a$ where $f_0$ is the normal oscillator frequency, a is the acceleration and $\Delta f$ is the resulting change in frequency. As an example, a high quality, low vibration sensitivity oscillator, with $f_0 = 10$ GHz, may have $\Gamma = 1 \times 10{-10}$ $g^{-1}$ so that its frequency changes by 1 Hz for every 1 'g' of acceleration, 'g' being the normal acceleration due to the earth's gravity. More commonly, the vibration sensitivity is used to predict phase noise under vibration using the relationship $L(f_m) = 20 \cdot \log_{10}(\Gamma \cdot |A|/2f_m)$, where $f_m$ is the vibration frequency and $A = (2 \cdot PSD)^{1/2}$ and PSD is the power spectral density of acceleration in $g^2/Hz$ (See for example A. Hati et al., "Vibration Sensitivity of Microwave Components," 2007 IEEE International Frequency Control Symposium Joint with the 21st European Frequency and Time Forum, Geneva, Switzerland, 2007, pp. 541-546). The effect of vibration is illustrated in general terms by FIG. 1 which shows that the phase noise 100 under vibration can exceed the phase noise 102 measured under static conditions due to the contribution of the acceleration power spectral density (PSD) 104.

Vibration sensitivity of oscillators is well known in the art and efforts have long been made to reduce F, frequently by means of mechanical design and selection of rigid components. When vibration degradation of phase noise remains an issue despite design efforts, steps are usually taken to isolate the oscillator from the vibration using a mechanical isolation system comprising interconnected springs and dampers. However, the design of vibration isolation systems can be challenging for low vibration frequencies, for example between $10$ Hz $\leq f_m \leq 100$ Hz. Hence schemes have been proposed to further reduce the vibration sensitivity of oscillators by electronic compensation means to reduce the reliance on and design effort required for isolation systems.

U.S. Pat. No. 4,891,611, for example, describes such a system which is illustrated in simplified form in FIG. 2 as applied to a voltage controlled oscillator (VCO) 200 in which the frequency may be controlled by an externally applied voltage. An accelerometer 202 is used to measure the acceleration experienced by the oscillator with an output voltage $V_a = k_a \cdot a$ where $k_a$ is the accelerometer sensitivity in $V \cdot g^{-1}$ and a is the acceleration in 'g'. The voltage output of the accelerometer is then amplified, by gain G 204, and fed into the frequency tuning port of the VCO 200. The frequency of oscillator output signal 206 will therefore be shifted by a total amount $\Delta f = \Gamma \cdot f_0 \cdot a + G \cdot k_a \cdot k_{VCO} \cdot a$ where $k_{VCO}$ is the tuning slope of the oscillator in $Hz \cdot V^{-1}$ and represents a relationship between the changes in carrier frequency and a tuning voltage applied at a particular location in the oscillator circuit. By arranging that $G \cdot k_a \cdot k_{VCO} = -\Gamma f_0$, the frequency shift of the oscillator can therefore, in principle, be reduced to 0, resulting in very low apparent vibration sensitivity. The term $G \cdot k_a \cdot a$ is a vibration compensation signal $V_{comp}$ 208 that is fed to the tuning port of VCO 200. The oscillator frequency responds to $V_{comp}$ according to the tuning slope $k_{VCO}$ at the tuning port of VCO 200 to provide the term $G \cdot k_a \cdot k_{VCO} \cdot a$.

Most oscillators exhibit behavior in which F can be assumed to remain constant over a very wide range of accelerations, (See for example John Vig "Quartz Crystal Resonators and Oscillators for Frequency Control and Timing Applications—A Tutorial" US Army Communications-Electronics Research, Development & Engineering Center Fort Monmouth, NJ, USA, 2004). In some cases, $\Gamma$ may vary with vibration frequency $f_m$ so that f will be written as $\Gamma(f_m)$ and it will be understood that filtering would need to be incorporated into the gain G so that variations in $G = G(f_m)$ match variations in $\Gamma = \Gamma(f_m)$ as discussed in U.S. Pat. No. 4,891,611. It is important to understand that this is an "open-loop" compensation system; the gain $G(f_m)$ must be determined experimentally and set during manufacture or tuning, the degree of reduction in apparent vibration sensitivity at the oscillator output depending on how well this is done.

Persons skilled in the art will understand that the discussion so far can be applied to any of the three orthogonal axes: X, Y & Z and that the outputs of three orthogonally-mounted accelerometers may be used and summed with independent gains $G_X$, $G_Y$ and $G_Z$ to reduce the apparent vibration sensitivity simultaneously in all three directions.

In many systems it is a requirement that the oscillator be phase locked to an external reference signal using a phase locked loop (PLL). As shown in FIG. 3, PLL circuitry 300 is responsive to an output signal 302 of a VCO 304 and a reference signal 306 to produce a PLL tuning signal, $V_{PLL}$. A summing circuit 308 sums $V_{PLL}$ with a vibration compensation signal $V_{comp}$ produced by an accelerometer(s) 310 and gain 312 and inputs the summed signal to the tuning port of VCO 304. Typically, the PLL circuitry 300 will be designed to utilize at least a large proportion of the acceptable voltage range at the tuning port of the oscillator and $V_{PLL}$ can be expected to vary significantly within that range over time as phase lock is maintained.

In an arrangement such as FIG. 3, it is important that the tuning slope $k_{VCO}$ remain constant over the range of the tuning voltage input utilized by $V_{PLL}$ so that the relationship $G \cdot k_a \cdot k_{VCO} = -\Gamma \cdot f_0$ is maintained while the PLL is operating. However, in many oscillators $k_{VCO}$ varies significantly over the tuning voltage range.

Consider for example a simple loop oscillator 400 as shown in FIG. 4 that includes an amplifier 402, a voltage controlled phase shifter (VCP) 404, and a resonator 406. As is well understood in the art, the oscillation frequency is adjusted by changing the phase shift within the loop by applying a tuning voltage Vtune to the VCP 404. The output in FIG. 4 can be taken from any convenient point in the loop without affecting the discussion and two alternative locations are shown simply to keep the example general.

In such a loop oscillator the frequency variation as a function of VCP phase shift depends on the insertion phase of the resonator 406 which is quite linear over the bandwidth of the resonator. However, the VCP 404 in such an arrangement designed for low phase noise applications will typically utilize reverse biased varactor diodes within the phase shift circuitry, usually resulting in a non-linear variation of phase shift, and hence oscillator frequency, with tuning voltage as shown by the representative tuning sensitivity curve 500 in FIG. 5A. The corresponding slope of the tuning curve 502, shown in FIG. 5B, shows the variation in $k_{VCO}$ which is the rate of change of frequency versus voltage, or the slope of the curve in FIG. 5A. It is not uncommon to see a factor of at least 2× and more typically 5× variation in the value of $k_{VCO}$ over the tuning voltage range. In this case it would be impossible to maintain the $G \cdot k_a \cdot k_{VCO} = -\Gamma \cdot f_0$ in the arrangement of FIG. 3 while utilizing the full tuning range.

If the vibration compensation circuitry is adjusted at the nominal tuning voltage input $V_{Nom}$ as shown in FIGS. 5A-5B, then, at any other voltage, the acceleration signal will be incorrectly compensated since $G \cdot k_a \cdot k_{VCO}(V \neq V_{Nom}) \neq -\Gamma \cdot f_0$. FIG. 6 illustrates the variation 600 from ideal acceleration compensation expressed in dB as may be calculated using the formula $20 \cdot \log_{10}((|k_{VCO}(V)/k_{NOM}-1|)$. FIG. 6 shows that the PLL voltage range would need to be restricted to a small fraction of the oscillator tuning port voltage range to achieve at least a nominal 20 dB decrease in vibration sensitivity (corresponding to a reduction in apparent F by a factor of 10). These ratios are for illustration only and in practice would be the subject of design choices. If the PLL voltage is allowed to vary over the range of tuning voltage, then at some points the compensation circuit will instead increase the vibration sensitivity.

A particular class of oscillator, often selected for use in high fidelity systems may be referred to as an Interferometric Noise Suppressed Oscillator (INSO). An INSO may utilize a sapphire-loaded cavity as the resonator and incorporate a noise degeneration circuit to suppress phase noise. An example of an INSO is described in U.S. Pat. No. 5,841,322 entitled "Phase Detector Using Carrier Suppression and Oscillator Using the Phase Detector" issued Nov. 24, 1998. As shown in FIG. 1 of U.S. Pat. No. 5,841,322, a microwave loop oscillator 10 includes a microwave amplifier 12, a high-Q resonator 14 and a phase shifter 18 among other components. A phase detector 28, which may also be referred to as an "interferometric bridge" is used to detect phase fluctuations in the oscillator loop and generate an error signal at the output of mixer 32. The error signal being a measure of frequency fluctuations from the nominal oscillation frequency. This error signal is amplified (and possibly filtered) by the control signal generator 62, which includes a low noise amplifier 13, before being fed back as a control signal into the loop phase shifter 18 to cancel the phase noise in the loop. The phase shifter 18 induces a phase shift in the loop in response to the control signal such that the noise close to the carrier frequency in the loop is suppressed. Flicker noise associated with microwave amplifier 48 would be detrimental to the operation of the oscillator. Carrier suppression ensures small signal operation of microwave amplifier 48, which reduces the amplifier's flicker noise in proportion to the signal power at the amplifier 48 input.

A phase-locked INSO locks the oscillator 10 to an external reference signal using a PLL. In a phase-locked INSO, the loop phase shifter 18 is not used to provide the VCO tuning port as in FIG. 3 because the noise-degeneration circuitry treats any signal added to the loop phase shifter control point as noise to be removed from the loop and reduces its effect by the gain of the noise-degeneration circuitry, typically 60 dB or more. Instead, frequency tuning is achieved by means of a voltage $V_{tune}$ such as $V_{PLL}$ applied to the phase shifter 42 within the carrier suppression block of phase detector 28. As before, phase shifter 42 has a non-linear relationship resulting in a non-linear variation of carrier frequency with tuning voltage that produces a tuning slope $K_{VCO}$ that varies over the tuning range of phase shifter 42. However, because the PLL operates "closed-loop" it can be relatively insensitive to such variations in $K_{VCO}$.

SUMMARY

The following is a summary that provides a basic understanding of some aspects of the disclosure. This summary is not intended to identify key or critical elements of the disclosure or to delineate the scope of the disclosure. Its sole purpose is to present some concepts of the disclosure in a simplified form as a prelude to the more detailed description and the defining claims that are presented later.

The present disclosure provides for active vibration compensation of Interferometric Noise Suppressed Oscillators (INSOs). In an INSO the error signal at the mixer output responds linearly to changes in carrier frequency. A vibration compensation signal is summed with the error signal at the input to the feedback amplifier to provide the control signal to the loop phase shifter to suppress close-in phase noise near the carrier frequency and to reduce the effects of mechanical vibrations on oscillator phase noise. The addition of the vibration compensation signal does however degrade carrier suppression, hence increases the flicker noise contributed by the INSO's LNA but does so without degrading overall oscillator phase noise. In a frequency tuned configuration such as a phase-locked INSO, the vibration compensation signal reduces the effects of mechanical vibrations on oscillator phase noise independent of the tuning voltage applied to the phase shifter.

These and other features and advantages of the disclosure will be apparent to those skilled in the art from the following detailed description of preferred embodiments, taken together with the accompanying drawings, in which:

DETAILED DESCRIPTION

Although an INSO provides much higher fidelity (i.e., much lower phase noise) than a standard loop oscillator and exhibits very low vibration sensitivity because of the combination of noise suppression and rigid, high-Q resonators (e.g., Sapphire resonators) that are typically used, certain applications may require even greater immunity to mechanical vibrations. One technique is to add active vibration compensation to reduce the effects of external vibrations on oscillator phase noise.

Figure 3:
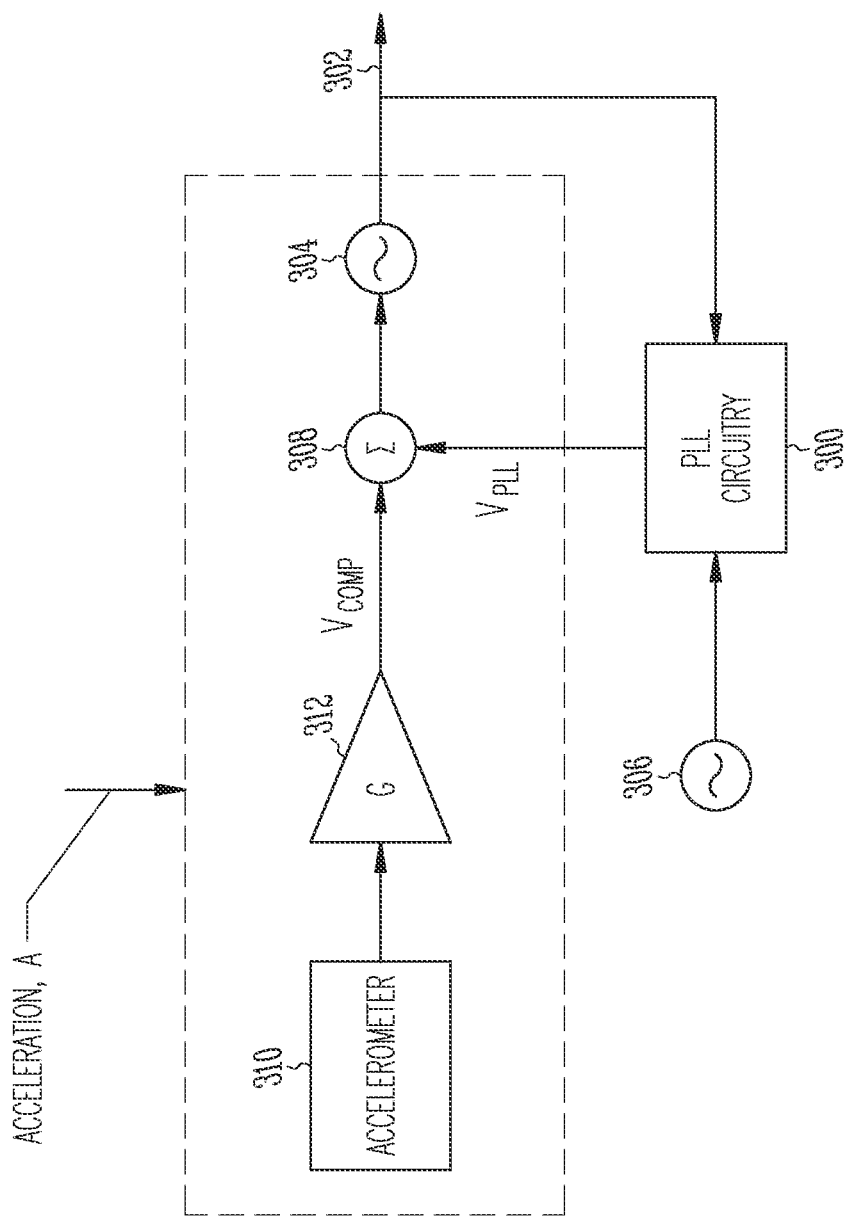
FIG. 3, as described above, is a diagram of the VCO of FIG. 2 in which the VCO is phase-locked to external reference signal.

The vibration compensation signal cannot be input to loop phase shifter as in FIG. 3 because the noise-degeneration circuitry treats any signal added to the loop phase shifter control point as noise to be removed from the loop and reduces its effect by the gain of the noise-degeneration circuitry, typically 60 dB or more.

Figure 1:
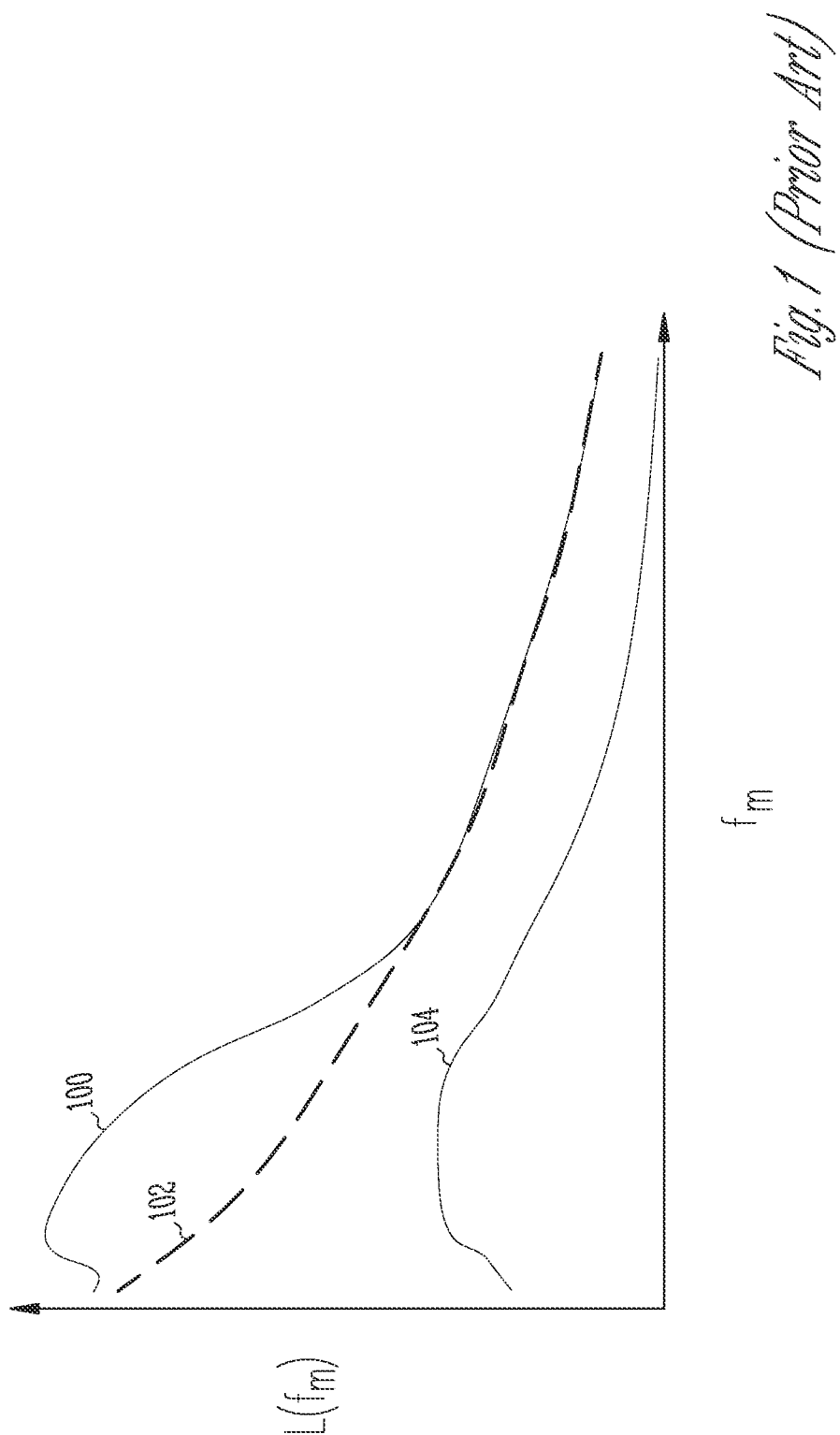
FIG. 1, as described above, is a plot of oscillator phase noise under static and vibration conditions.
Figure 2:
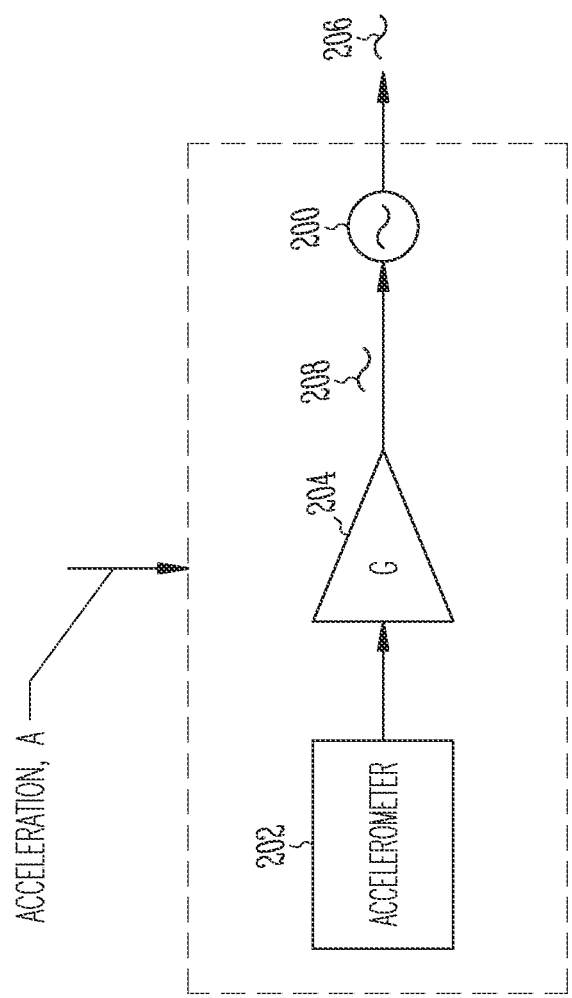
FIG. 2, as described above, is a diagram of a voltage controlled oscillator (VCO) responsive to a vibration compensation signal to suppression the effects of vibration on oscillator phase noise.

The vibration compensation signal could be input to the phase shifter 42 in the carrier suppression block of phase detector 28 of the oscillator as shown in FIG. 1 of U.S. Pat. No. 5,841,322. However, phase shifter 42 has a non-linear tuning sensitivity that produces a tuning slope $K_{VCO}$ that varies over the tuning range of phase shifter 42. Vibration compensation is an "open-loop" compensation system. The overall gain must be determined experimentally and be stable over the tuning range to provide vibration compensation that reduces the effects of vibration on oscillator phase noise over that tuning range. The variation of $K_{VCO}$ over the tuning range of the vibration compensation signal will degrade the phase noise. Because the of the already low vibrations sensitivity, the vibration compensation may be understood to apply $V_{Comp}$ of a magnitude that would make very small changes in oscillator frequency. For example, in a 10 GHz oscillator with $\Gamma=10^{-10}$ $g^{-1}$ undergoing a 1 g acceleration, $V_{Comp} \cdot k_{VCO}$ would be equivalent to only 1 Hz. Addition of the vibration compensation voltage, $V_{Comp}$ to $V_{Tune}$, therefore doesn't change $V_{Tune}$ significantly in an oscillator that might typically have a full tuning range of several kHz. However, any non-linearity in the tuning curve of the oscillator will result in generation of unwanted harmonic effects.

Figure 6:
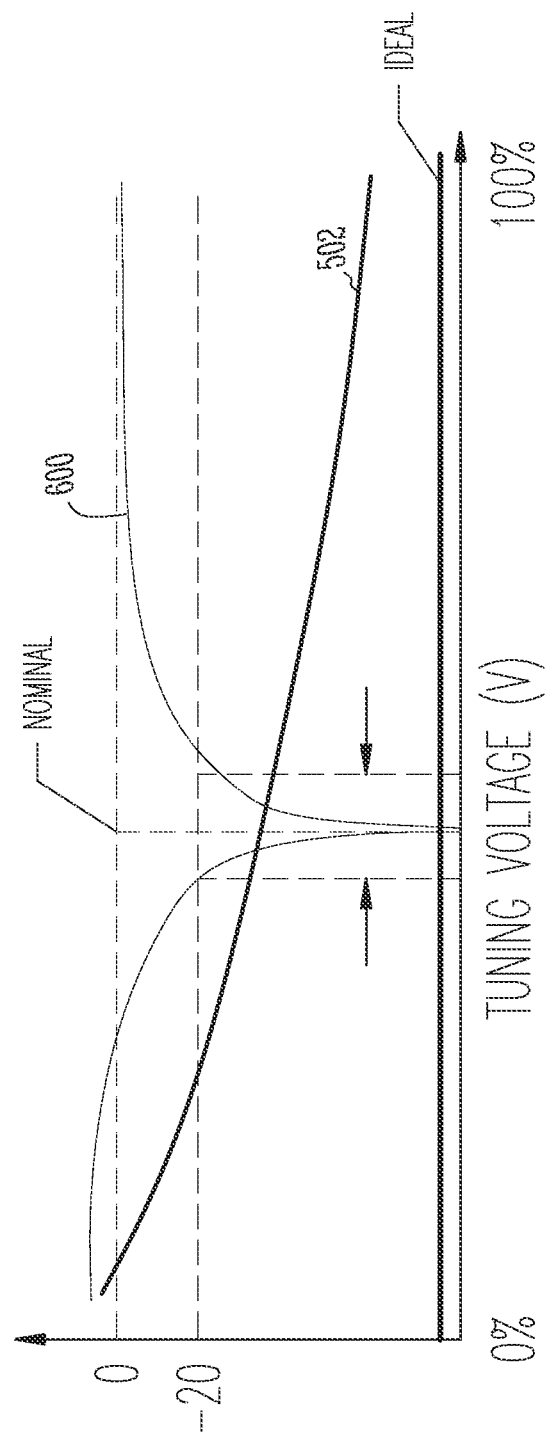
FIG. 6, as described above, is a plot of oscillator phase noise over the tuning range of the VCP.

In a frequency-tuned INSO, a tuning voltage such as $V_{PLL}$ is also applied to the phase shifter 42. The tuning range of the tuning voltage is much larger than that of the vibration compensation signal. For example, the tuning voltage may need to induce a 1 kHz change in the carrier frequency to compensate for thermal drifts. As such the magnitude of variations in Vtune may be 1,000× that of the variations in $V_{Comp}$. Hence problems associated with non-linearity are of paramount importance in applications requiring the INSO to be tuned such as when phase locked using a PLL and the open-loop vibration compensation system will fail to suppress the effects on phase noise caused by external vibrations across that tuning range as shown by curve 600 in FIG. 6.

Figure 4:
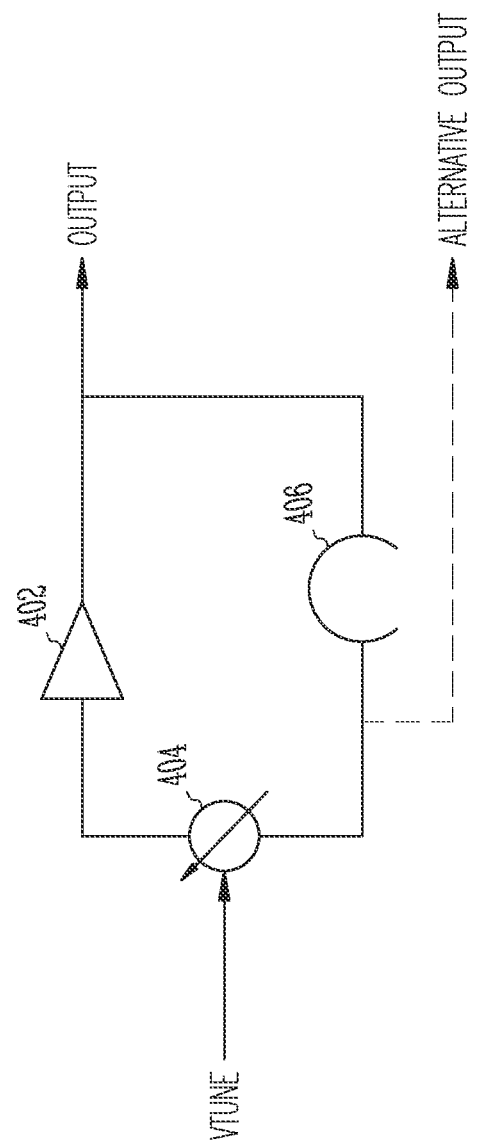
FIG. 4, as described above, is a diagram of a loop oscillator in which the oscillation frequency is adjusted by application of a tuning voltage such as the vibration compensation signal to the voltage control phase shifter (VCP) in the loop.
Figure 5A:
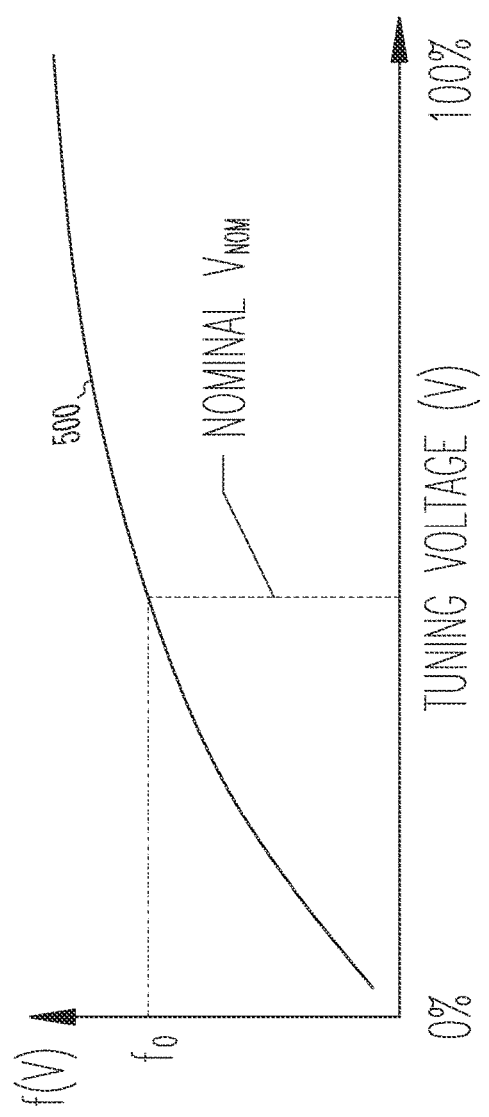
FIGS. 5A-5B, as described above, are plots of the loop oscillator's tuning sensitivity and tuning slope $K_{VCO}$ (the slope of the tuning sensitivity)
Figure 5B:
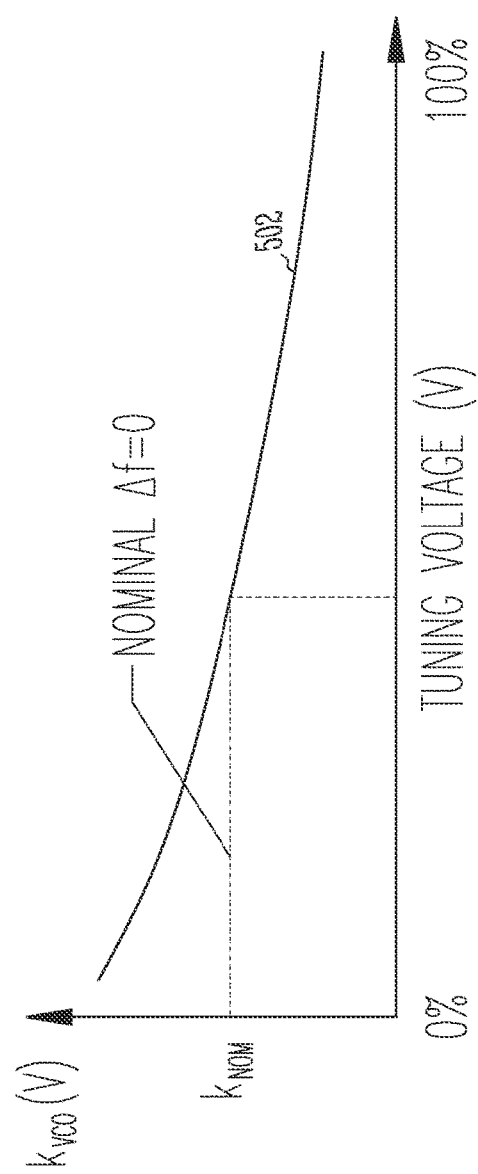

More specifically, for the purposes of discussion, with reference to FIG. 1 of U.S. Pat. No. 5,841,322 two arms of the interferometer are identified: the first comprising the attenuator 44 and phase shifter 42 referred to as the "reference arm", and the second comprising the connection between the circulator 22 and combiner 46 as the reflection arm. To maintain balance in the interferometer, the signals from both reference and reflection arms must arrive at the combiner 46 with the same amplitude but out of phase so that cancellation occurs. Hence, any phase shift in the reference arm must be matched by an equal and opposite phase shift in the reflection arm signal. In response to a phase shift in the reference arm and operation of the feedback circuit, the equal and opposite phase shift in the reflection arm comes about by virtue of a change in oscillation frequency and the reflection phase characteristics of the resonator. Again, the phase shift in reflection versus frequency is quite linear over a significant fraction of the resonator bandwidth. However, just as the non-linear voltage to phase relationship of the VCP in FIG. 4 produces a non-linear tuning curve, the same is true in the INSO, leading to a very similar tuning curve to that shown in FIG. 5A. Thus, the adaptation of applying the vibration compensation signal, alone or summed with a tuning voltage, to phase shifter 42 in the carrier suppression block of phase detector 28 suffers from the disadvantages just discussed.

In accordance with present disclosure, a vibration compensation signal is summed with the error signal at the output of mixer 32 in FIG. 1 of U.S. Pat. No. 5,841,322 at the input to amplifier 64 of the control signal generator. The error signal responds linearly to changes in carrier frequency and thus the $K_{VCO}$ at this point in the oscillator is constant. Because vibration compensation operates "open-loop" this greatly increases the utility of the vibration compensation as it allows the oscillator to be tuned independently by the phase shifter while maintaining the desired constant value of $k_{VCO}$ relevant to the vibration compensation signal. However, inserting an additional signal into the oscillator loop at this point goes against long-established practice taught by U.S. Pat. No. 5,841,322 because doing so degrades carrier suppression, increasing the flicker noise contribution of amplifier 48.

Figure 7:
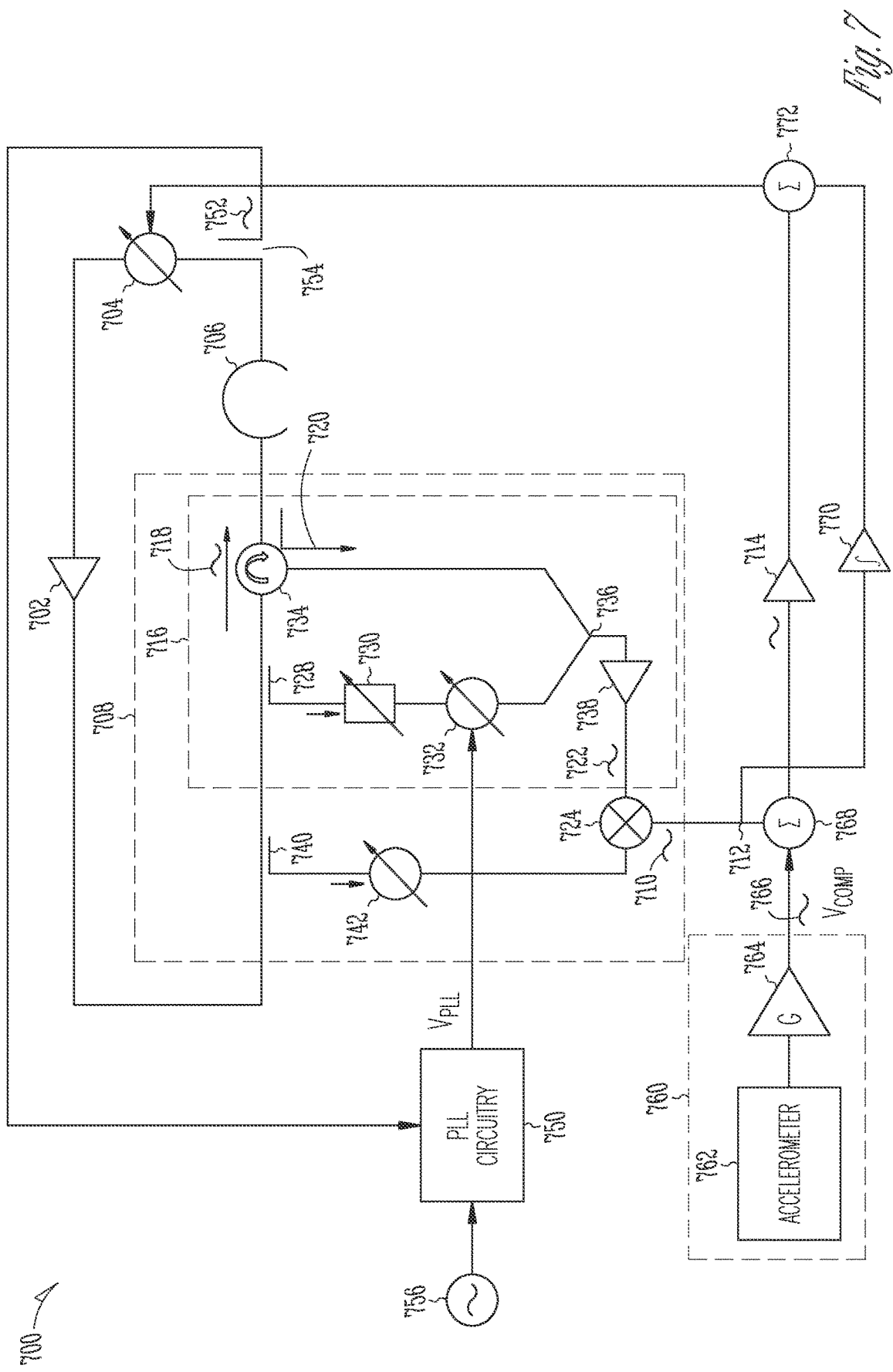
FIG. 7 is a simplified diagram of a vibration compensated phase-locked INSO in which the vibration compensation signal is added to the frequency error signal at the input of the feedback amplifier to suppress the effects of external vibrations on oscillator phase noise over the tuning range.

A simplified schematic of a vibration-compensated phase-locked INSO 700 is shown in FIG. 7. The basic oscillator comprises a sustaining amplifier 702, a loop phase shifter 704 and a resonator 706, such as a sapphire-loaded cavity, configured as a simple loop oscillator. One skilled in the art will understand that other components not directly relevant to the discussion have been omitted for simplicity. A phase detector or interferometric bridge 708 is used to detect phase fluctuations in the oscillator loop and generate an error signal 710 at mixer output 712 being a measure of frequency fluctuations from the nominal oscillation frequency. This error signal 710 is amplified (and possibly filtered) by a feedback amplifier 714 within a control signal generator before being fed back into the loop phase shifter 704 to cancel the phase noise in the loop and suppress close-in phase noise near the carrier frequency.

Phase detector 708 includes a carrier suppression circuit 716 responsive to a first signal 718 at a carrier frequency that propagates around the loop and a second signal 720 that is a reflection of first signal 718 off of resonator 706 to produce a carrier suppressed signal 722, a mixer 724 responsive to the carrier suppressed signal 722 and the first signal 718 to produce the error signal 710 corresponding to the phase difference between the first and second signals.

Carrier suppression circuit 716 includes a "reference arm" and a "reflection arm". The reference arm includes a reference arm coupler 728 to couple a portion of first signal 718 out of the loop, a variable attenuator 730 and a phase shifter 732. The reflection arm includes a connection between circulator 734 that couples second signal 720 out of the loop. To maintain balance in the interferometer, the signals from both reference and reflection arms must arrive at a combiner 736 with the same amplitude but out of phase so that cancellation occurs. Hence, any phase shift in the reference arm is matched by an equal and opposite phase shift in the reflection arm signal due to the action of the feedback. Combiner 736 produces carrier suppressed signal 722 that is fed to a low noise amplifier 738 that amplifies the carrier suppressed signal 722. A mixer local oscillator coupler 740 couples a portion of first signal 718 from the loop that is fed through a mixer local oscillator phase shifter 744 to mixer 724.

To phase-lock the INSO, PLL circuitry 750 is responsive to an output signal 752 extracted from the oscillator loop via coupler 754 and a reference signal 756 to produce a PLL tuning signal, $V_{PLL}$ that is applied to the tuning port of phase shifter 732 in the reference arm of the carrier suppression circuit. Although the tuning slope $K_{VCO1}$ associated with phase shifter 732 is not constant over the tuning range, the closed-loop characteristics of the PLL are insensitive to variations in $K_{VCO1}$ and the oscillator frequency will be locked to the reference signal frequency.

To provide active vibration compensation for the INSO 700, a vibration sense circuit 760 including one or more accelerometers 762 (e.g., one or more of the orthogonal X, Y, Z axes summed together) and gain G 764 is configured to produce a vibration compensation signal $V_{Comp}$ 766 (e.g., $G \cdot k_a \cdot a$) indicative of mechanical vibrations and as a function of an oscillator tuning slope $K_{vco2}$ that is summed with the error signal 710 by summer 768 and fed to the feedback amplifier 714. The linearity of the error signal 710 to changes in oscillator frequency at the output of the mixer maintains a constant value of oscillator tuning slope $K_{vco2}$ to suppress the effects of mechanical vibrations on oscillator phase noise over a tuning range of the oscillator.

An accelerometer aligned with the earth's gravitational field will produce a constant DC output in addition to the response to vibrational accelerations. This will produce a constant degradation of the flicker noise in amplifier 738. By integrating the mixer error signal 712 via integrator 770 and summing it via summer 772 into either the feedback amplifier input or the loop phase shifter input (shown here), this DC offset can be removed on time scales longer than the integrator time constant.

To understand the operation of this arrangement, consider the voltage 710 generated at 712 in the absence of the feedback being applied between amplifier 714 and phase shifter 704. At the nominal oscillating frequency, $f_0$, at or near the center of resonance, the signal in the reference arm, $P_{REF}$ (Bold used to indicate a phasor or vector quantity having magnitude and phase) and the reflection arm, $P_{RFL}$, are equal and opposite, $P_{REF} = -P_{RFL}$ and cancel at the combiner 736 leading to zero carrier power at the output of LNA 738 and zero voltage at the mixer output 712. However, if the frequency of oscillation varies by an amount much less than the bandwidth of the resonator, $\Delta f \ll BW_{RES}$, (for example because of a small fluctuation in loop phase caused by noise) then the power in the reflection arm becomes $P_{RFL} (1 + \Delta f \cdot k_{RflPh})$ where $k_{RflPh} = dS_{11}</df$ is the slope of the resonator reflection phase with respect to frequency. Hence the input power at LNA 738 becomes $P_{REF} - P_{RFL} = P_{RFL} \Delta f \cdot k_{RflPh}$ and correct adjustment of the LO Phase shifter 742 results in a voltage at the mixer output 712 directly proportional to $\Delta f \cdot k_{RflPh}$. In typical applications the tuning range of the oscillator will be of order kHz while the BW of the resonator will be ~100 kHz and in such cases $k_{RflPh}$ remains linear over the tuning range and the error signal voltage 710 at 712 is linearly related to a frequency error in the oscillator.

The normal action of the noise degeneration circuit when the feedback between amplifier 714 and phase shifter 704 is connected, is to reduce the error signal 710 at mixer output 712 (the input to amplifier 714) to very close to zero, the reduction depending on the gain around the feedback loop. Adding a voltage Vcomp 766 means the circuit will instead produce an equal and opposite voltage at mixer output 712, and a proportional change in oscillator frequency depending principally on $k_{RflPh}$ and being independent of any phase shifter characteristic. Thus, an alternative means of tuning the oscillator frequency is available, one that is highly linear in voltage. This has the effect of holding tuning slope $K_{VCO2}$ at this point in oscillator constant.

In a frequency-tuned (e.g., phase-locked) INSO configuration, summing the vibration compensation signal to the error signal reduces the effects of mechanical vibrations on oscillator phase noise independent of the tuning voltage applied to the phase shifter 732. Even though $K_{VCO1}$ at reference arm phase shifter 732 varies by perhaps 2× over the full tuning range this has no effect on the vibration compensation. $K_{VCO2}$ characterizes a tuning slope relating the carrier frequency to the summed voltage of the error signal and the vibration compensation signal. Because the error signal responds linearly to changes frequency under open-loop conditions, $K_{VCO2}$ remains constant. This is true independent of fixed or variable tuning voltage applied to reference arm phase shifter 732.

Figure 8:
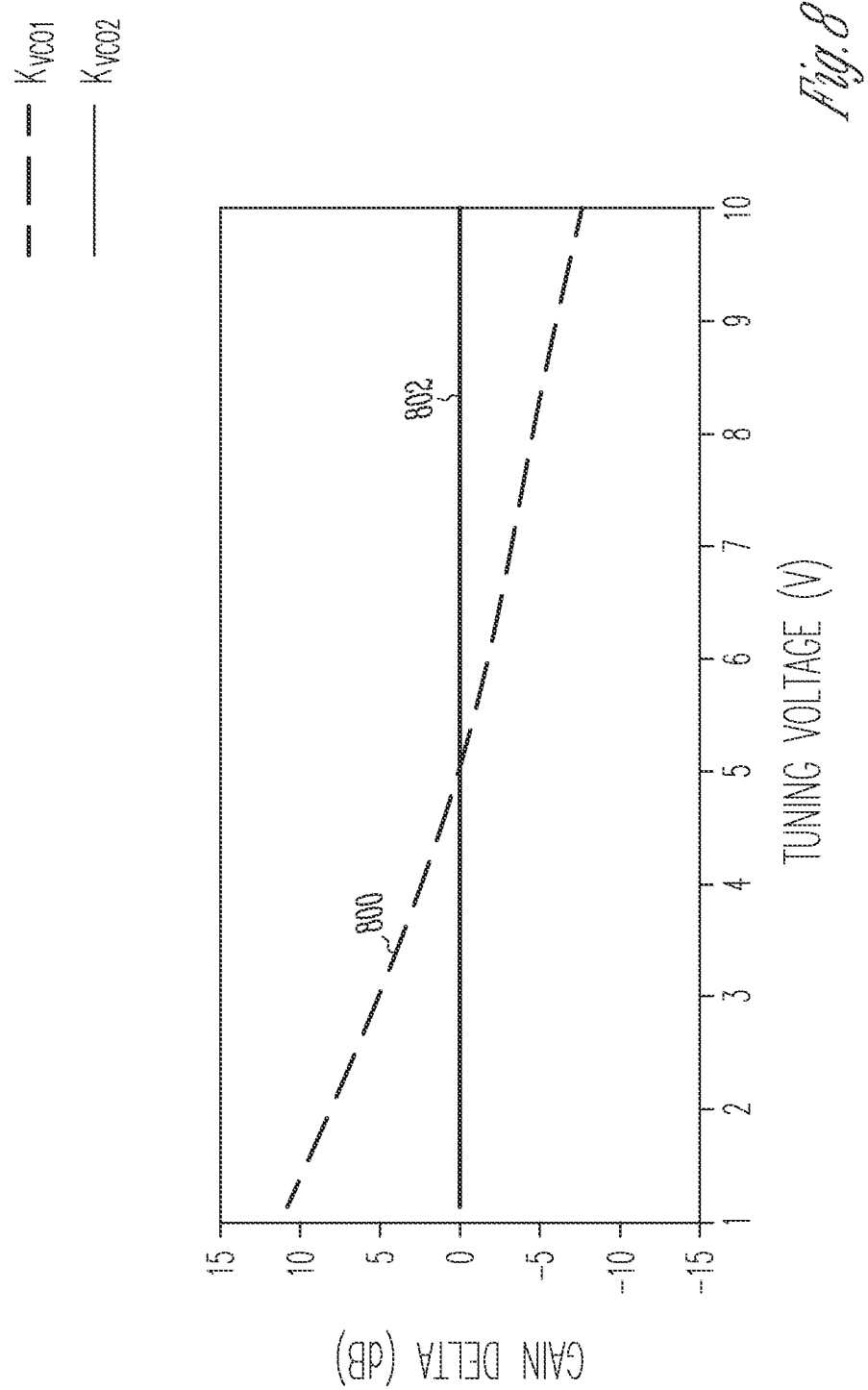
FIG. 8 is a plot of the tuning slopes $K_{VCO1}$ and $K_{VCO2}$ at the inputs to the phase shifter and the feedback amplifier, respectively.

Referring now to FIG. 8, tuning slopes $K_{VCO1}$ 800 at phase shifter 732 in the reference arm of the carrier suppression circuit and $K_{VCO2}$ 802 at mixer output 712 characterize the non-linear and linear tuning sensitivities at those locations in the oscillator. Application of the PLL tuning voltage $V_{PLL}$ to the tuning port of phase shifter 732 works to phase-lock the oscillator frequency to the reference signal frequency in large part because phase-locking is closed loop. By comparison, vibration compensation is open-loop. The effective gain applied to the acceleration measurements must be highly stable across the tuning range of the oscillator to effectively reduce the effects on oscillator phase noise due to external vibration. Tuning slope $K_{VCO2}$ is "constant" as defined by a variation of less than 1.2× and preferably less than 1.1× over the oscillator tuning range.

Figure 9:
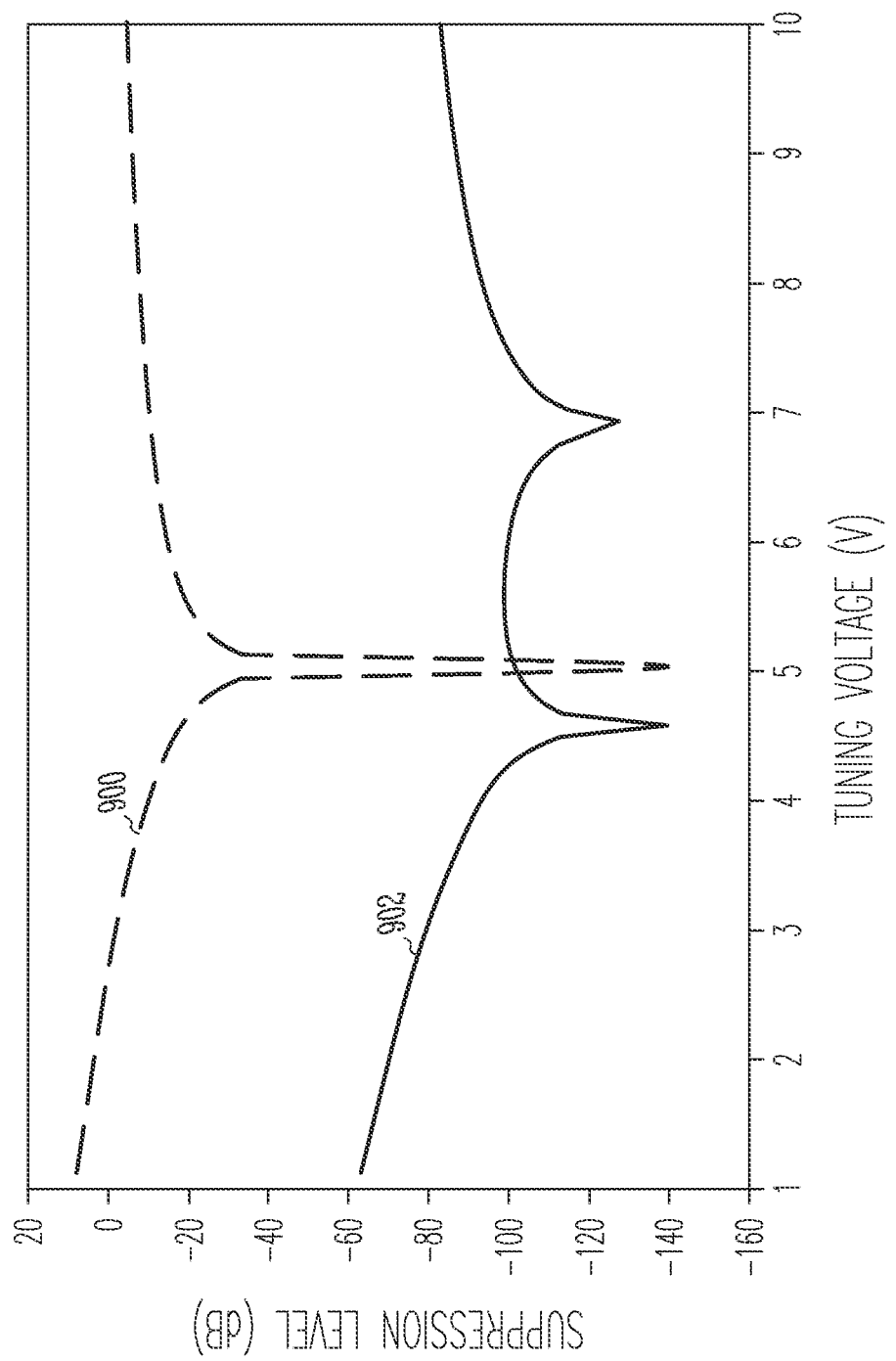
FIG. 9 is a plot of comparing the effects of vibration compensation on oscillator phase noise with the vibration compensation signal applied at the inputs to the phase shifter and the feedback amplifier, respectively.

Referring now to FIG. 9, the effect on oscillator phase noise of applying the vibration compensation signal at the tuning port of phase shifter 732 and at the mixer output 712 are shown in noise suppression curves 900 and 902, respectively. For application of $V_{comp}$ to phase shifter 732, the PLL voltage range would need to be restricted to a small fraction of the oscillator tuning port voltage range to achieve at least a nominal 20 dB decrease in vibration sensitivity (corresponding to a reduction in apparent F by a factor of 10). By comparison, for application of $V_{comp}$ to mixer output 712, the PLL voltage range can span the full oscillator tuning port voltage range to achieve at minimum 20 DB decrease in vibration sensitivity and suitably at least 40 dB decrease over the full span of tuning voltage at the phase shifter.

Although the application of $V_{comp}$ to mixer output 712 instead of the tuning port of phase shifter 732 achieves a marked improvement in phase noise in the presence of external vibration, the insertion of an additional signal into the oscillator loop at this point goes against long-established practice taught by U.S. Pat. No. 5,841,322 because doing so degrades carrier suppression, increasing the flicker noise contribution of LNA 738.

Figure 10:
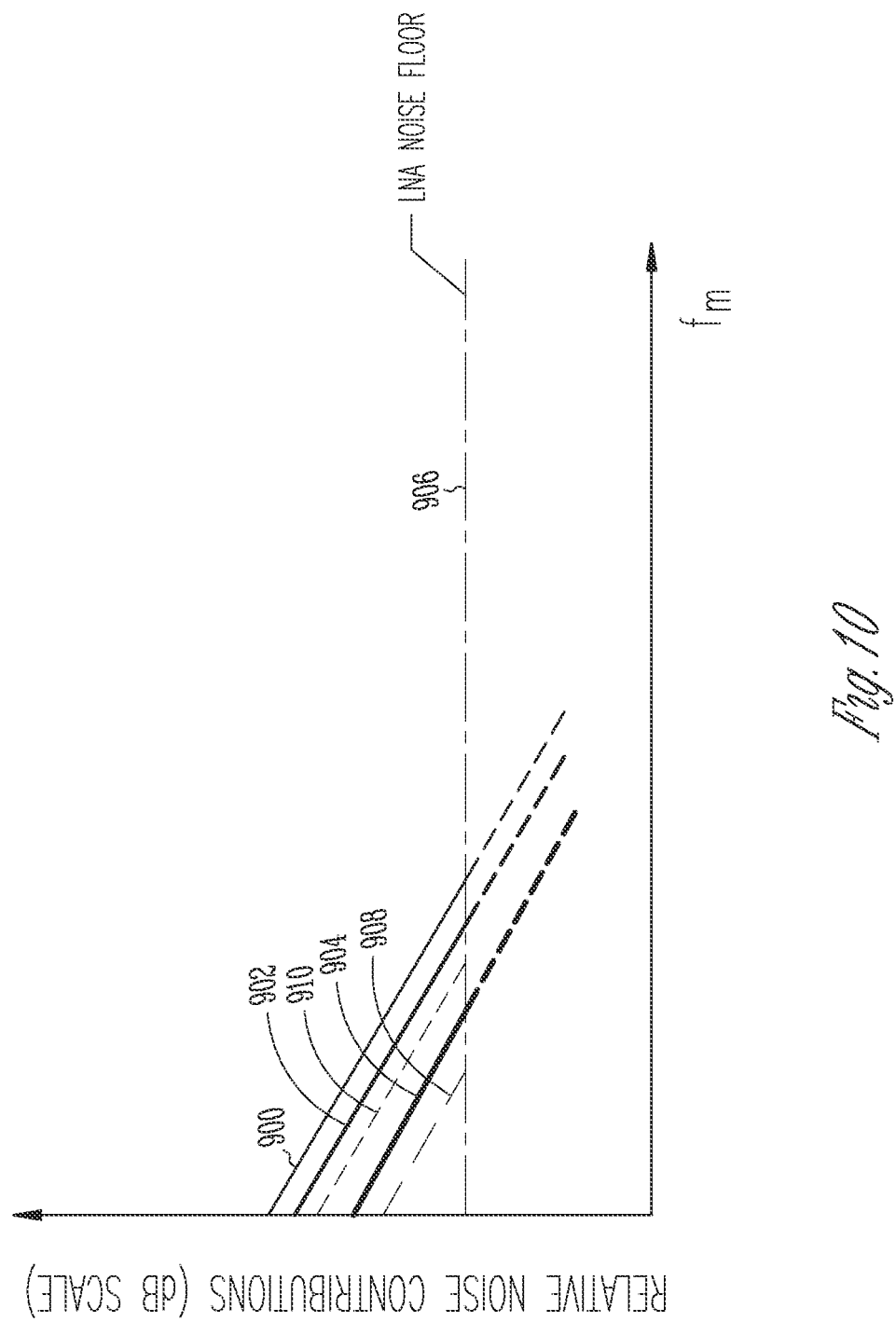
FIG. 10 is a plot of noise contributions for components in the phase detector relative to the LNA white noise floor.

However, with many suitable choices of LNA 738 the effectiveness of the carrier suppression results in a flicker noise contribution from the LNA 738 of 10 dB, or more, lower than the noise generated by practical choices for other components such as attenuator 730, phase shifter 732, and mixer 734. For example, FIG. 10 shows these noise contributions 900, 902 and 904 from the attenuator, phase shifter and mixer, respectively, relative to the white noise floor 906 of LNA 738. As carrier suppression is degraded, the flicker or 1/f, noise in the amplifier increase. Line 908 shows a level of noise due to degraded carrier suppression that is still somewhat lower than the mixer noise floor 904. The line 910 shows a further degraded level of carrier suppression where the amplifier noise exceeds the mixer noise but is still below the noise generated by both the attenuator and phase shifter. Since the final phase noise of the oscillator, while the noise degeneration circuit is operative, depends on the sum of these noise contributors, there is margin to degrade the level of carrier suppression without degrading the oscillator phase noise.

While several illustrative embodiments of the disclosure have been shown and described, numerous variations and alternate embodiments will occur to those skilled in the art. Such variations and alternate embodiments are contemplated, and can be made without departing from the spirit and scope of the disclosure as defined in the appended claims.

We claim:

1. A vibration compensated interferometric noise suppressed oscillator (INSO), comprising:
   an amplifier, a loop phase shifter responsive to a control signal, and a resonator arranged in a loop to oscillate and produce a first signal at a carrier frequency, a second signal produced by reflection of a portion of the first signal by the resonator;
   a carrier suppression circuit responsive to the first and second signals to produce a carrier suppressed signal, a mixer responsive to the carrier suppressed signal and the first signal to produce an error signal corresponding to the phase difference between the first and second signals, wherein the error signal responds linearly to changes in the carrier frequency;
   a control signal generator including a feedback amplifier that amplifies the error signal to provide the control signal to the loop phase shifter to suppress close-in phase noise near the carrier frequency; and
   a vibration sense circuit configured to produce a vibration compensation signal indicative of mechanical vibrations, said vibration compensation signal summed with the error signal and fed to the control signal generator to reduce the effects of mechanical vibrations on oscillator phase noise.

2. The INSO of claim 1, further comprising a low noise amplifier (LNA) that amplifies the carrier suppressed signal, wherein summing the vibration compensation signal to the error signal degrades carrier suppression and increases flicker noise contributed by the LNA without degrading oscillator phase noise.

3. The INSO of claim 2, wherein the carrier suppression circuit includes a reference arm having an attenuator and a phase shifter, wherein at least one of the attenuator, phase shifter and mixer have noise contributions that is greater than a noise floor of the LNA, wherein a level of noise due to degraded carrier suppression is greater than the noise floor but less than the noise contribution of the at least one of the attenuator, phase shifter and mixer.

4. The INSO of claim 1, wherein the vibration compensation signal is $G \cdot k_a \cdot a$ where G is gain, a is the acceleration measured in gs, and $k_a$ is an accelerometer sensitivity in $V \cdot g^{-1}$, wherein the carrier frequency responds to the vibration compensation signal according to a tuning slope $K_{VCO2}$ to provide the term $G \cdot k_a \cdot k_{VCO2} \cdot a$ to reduce the effects of mechanical vibrations on oscillator phase noise.

5. The INSO of claim 1, further comprising an integrator configured to receive the error signal and generate an integrated output signal that is summed into either the feedback amplifier or the control signal to remove a DC offset.

6. The INSO of claim 1, wherein carrier suppression circuit includes a phase shifter responsive to a tuning voltage to adjust the carrier frequency, wherein the vibration sense circuit reduces the effects of mechanical vibrations on oscillator phase noise independent of the tuning voltage applied to the phase shifter.

7. The INSO of claim 6, wherein the carrier frequency responds to the tuning voltage according to a first tuning slope $K_{VCO1}$ that varies with the applied tuning voltage over a tuning range at the phase shifter, wherein the carrier frequency responds to the vibration compensation signal according to a second tuning slope $K_{VCO2}$ that is constant over the tuning range.

8. The INSO of claim 6, wherein the tuning voltage is a phase locked loop (PLL) voltage $V_{PLL}$ that locks the carrier frequency to an external reference frequency.

9. The INSO of claim 6, wherein a tuning range of the tuning voltage is at least 1,000× a tuning range of the vibration compensation signal.

10. The INSO of claim 6, wherein the suppression of phase noise due to the effects of mechanical vibrations is at least 20 db over a tuning range of the tuning voltage.

11. An interferometric noise suppressed oscillator (INSO), comprising:
    an amplifier, a loop phase shifter responsive to a control signal, and a resonator arranged in a loop to oscillate and produce a first signal at a carrier frequency, a second signal produced by reflection of a portion of the first signal by the resonator;
    a carrier suppression circuit responsive to the first and second signals to produce a carrier suppressed signal, a mixer responsive to the carrier suppressed signal and the first signal to produce an error signal corresponding to the phase difference between the first and second signals, wherein the error signal responds linearly to changes in the carrier frequency,
    said carrier suppression circuit including a phase shifter responsive to a tuning voltage to adjust the carrier frequency;
    a control signal generator including a feedback amplifier that amplifies the error signal to provide the control signal to the loop phase shifter to suppress close-in phase noise near the carrier frequency; and
    a vibration sense circuit configured to produce a vibration compensation signal indicative of mechanical vibrations, the vibration compensation signal being summed with the error signal that is fed to the control signal generator to reduce the effects of mechanical vibrations on oscillator phase noise independent of the tuning voltage applied to the phase shifter.

12. The INSO of claim 11, wherein the carrier frequency responds to the tuning voltage according to a first tuning slope $K_{VCO1}$ that varies with the applied tuning voltage over a tuning range at the phase shifter, wherein the carrier frequency responds to the vibration compensation signal according to a second tuning slope $K_{VCO2}$ that is constant over the tuning range.

13. The INSO of claim 11, wherein the suppression of phase noise due to the effects of mechanical vibrations is at least 20 db over a tuning range of the tuning voltage.

14. The INSO of claim 11, further comprising a low noise amplifier (LNA) that amplifies the carrier suppressed signal, wherein summing the vibration compensation signal to the error signal degrades carrier suppression and increases flicker noise contributed by the LNA without degrading oscillator phase noise.

15. The INSO of claim 14, wherein the carrier suppression circuit includes a reference arm having an attenuator and a phase shifter, wherein at least one of the attenuator, phase shifter and mixer have noise contributions that is greater than a noise floor of the LNA, wherein a level of noise due to degraded carrier suppression is greater than the noise floor but less than the noise contribution of the at least one of the attenuator, phase shifter and mixer.

16. A method of suppressing effects on oscillator phase noise in an interferometric noise suppressed oscillator (INSO) due to external vibrations, wherein an interferometric noise suppressed oscillator (INSO), the method comprising:
  sensing one or more accelerations of the INSO;
    producing a vibration compensation signal responsive to the one or more accelerations;
    summing the vibration compensation signal with an error signal at an output of a mixer in the INSO, wherein the error signal responds linearly to changes in a carrier frequency; and
  applying the vibration compensation and error signals to a feedback amplifier in the INSO to provide a control signal to a loop phase shifter in the INSO to suppress close-in phase noise near the carrier frequency and to reduce the effects of mechanical vibrations on oscillator phase noise.

17. The method of claim 16, wherein summing the vibration compensation signal to the error signal degrades carrier suppression and increases flicker noise contributed by a low noise amplifier (LNA) in the INSO without degrading oscillator phase noise.

18. The method of claim 16, further comprising:
  applying a tuning voltage to a phase shifter to adjust the carrier frequency, wherein summing the vibration compensation signal with the error signal reduces the effects of mechanical vibrations on oscillator phase noise independent of the tuning voltage applied to the phase shifter.

19. The method of claim 18, wherein the carrier frequency responds to the tuning voltage according to a first tuning slope $K_{VCO1}$ that varies with the applied tuning voltage over a tuning range at the phase shifter, wherein the carrier frequency responds to the vibration compensation signal according to a second tuning slope $K_{VCO2}$ that is constant over the tuning range.

20. The method of claim 18, wherein the suppression of phase noise due to the effects of mechanical vibrations is at least 20 db over a tuning range of the tuning voltage.

* * * * *

UNITED STATES PATENT AND TRADEMARK OFFICE
CERTIFICATE OF CORRECTION

PATENT NO. : 12,237,810 B1  
APPLICATION NO. : 18/364981  
DATED : February 25, 2025  
INVENTOR(S) : Dervay et al.

Page 1 of 1

It is certified that error appears in the above-identified patent and that said Letters Patent is hereby corrected as shown below:

In the Drawings

Sheet 9 of 10, Fig. 9, delete "RADITIONAL" and insert -- TRADITIONAL -- therefor In the Specification In Column 1, Line 25, delete "F" and insert --Γ-- therefor In Column 1, Line 29, delete "Γ=1×10-10" and insert --Γ=1×10$^{-10}$-- therefor In Column 1, Line 46, delete "F," and insert --Γ,-- therefor In Column 2, Line 14, delete "F" and insert --Γ-- therefor In Column 2, Line 21, delete "f" and insert --Γ-- therefor In Column 3, Line 26, delete "F" and insert --Γ-- therefor In Column 8, Line 57, delete "F" and insert --Γ-- therefor Signed and Sealed this  
Thirteenth Day of January, 2026

John A. Squires  
*Director of the United States Patent and Trademark Office*